United States Patent
Chakravarti et al.

(10) Patent No.: US 7,767,579 B2
(45) Date of Patent: Aug. 3, 2010

(54) PROTECTION OF SIGE DURING ETCH AND CLEAN OPERATIONS

(75) Inventors: Ashima B Chakravarti, Hopewell Junction, NY (US); Zhijiong Luo, Carmel, NY (US); Renee Tong Mo, Briarcliff Manor, NY (US); Shreesh Narasimha, Beacon, NY (US); Katsunori Onishi, Fukuoka (JP)

(73) Assignee: International Business Machines Corporation, Armonk, NY (US)

( * ) Notice: Subject to any disclaimer, the term of this patent is extended or adjusted under 35 U.S.C. 154(b) by 312 days.

(21) Appl. No.: 11/954,802

(22) Filed: Dec. 12, 2007

(65) Prior Publication Data

US 2009/0155969 A1    Jun. 18, 2009

(51) Int. Cl.
*H01L 21/44* (2006.01)
*H01L 21/31* (2006.01)
*H01L 21/469* (2006.01)

(52) U.S. Cl. ............................ 438/655; 257/E21.403; 438/790

(58) Field of Classification Search .................. 438/655, 438/790, 285, 220; 257/E21.631, E21.403, 257/E21.635
See application file for complete search history.

(56) References Cited

U.S. PATENT DOCUMENTS

| | | | |
|---|---|---|---|
| 5,412,246 A | 5/1995 | Dobuzinsky et al. | |
| 6,246,305 B1 | 6/2001 | Youngner et al. | |
| 6,849,883 B2 | 2/2005 | Okihara | |
| 7,144,767 B2 | 12/2006 | Chidambarrao et al. | |
| 7,176,481 B2 | 2/2007 | Chen et al. | |
| 2002/0182822 A1 | 12/2002 | Mandelman et al. | |
| 2004/0142577 A1 | 7/2004 | Sugawara et al. | |
| 2005/0082616 A1 | 4/2005 | Chen et al. | |
| 2005/0136610 A1 | 6/2005 | Kitagawa et al. | |
| 2006/0237785 A1 | 10/2006 | Ieong et al. | |
| 2007/0009398 A1 | 1/2007 | Duvinage et al. | |
| 2007/0065593 A1 | 3/2007 | Wajda et al. | |
| 2007/0066084 A1 | 3/2007 | Wajda et al. | |
| 2007/0099435 A1 | 5/2007 | Sugawara et al. | |
| 2007/0221964 A1* | 9/2007 | Amos et al. | ................. 257/288 |
| 2008/0090412 A1* | 4/2008 | Dyer et al. | ................. 438/655 |

* cited by examiner

*Primary Examiner*—Walter L Lindsay, Jr.
(74) *Attorney, Agent, or Firm*—Joseph Petrokaitis; Roberts Mlotkowski Safran & Cole, P.C.

(57) ABSTRACT

A method of making a semiconductor device includes forming a transistor structure having one of an embedded epitaxial stressed material in a source and drain region and a stressed channel and well, subjecting the transistor structure to plasma oxidation, and removing spacer material from the transistor structure.

20 Claims, 11 Drawing Sheets

PROTECTION OF SIGE DURING ETCH AND CLEAN OPERATIONS

FIELD OF THE INVENTION

The invention generally relates to methods for manufacturing a semiconductor device with improved device performance, and, more particularly, to a semiconductor device and method of making a semiconductor device which includes growing a protective layer over an embedded epitaxial stress imparting material.

BACKGROUND OF THE INVENTION

SiGe tends to oxidize rapidly in air, forming oxides of both Si and Ge. The oxides of Ge tend to be soluble in water. As a result, the near surface region which includes the SiGe is subsequently depleted of Ge. This results in surface roughness that may be a function of the initial Ge concentration. It is therefore desirable to protect the exposed SiGe during general cleaning operations, such as resist strips and post etch cleans.

Processes which utilize an embedded SiGe integration flow typically involve a spacer removal after SiGe growth. The SiGe S/D region(s) should therefore be protected from the severe metallic contamination when, for example, phosphoric acid is used for the spacer removal.

In general, it is known to use thermal protecting oxides to protect surfaces. However, channel stresses derived for the SiGe S/D region(s) will relax if a standard thermal oxidation is performed. This is due to the ease in which the Ge diffuses into a Si substrate. Additionally, the SiGe layer may be substantially oxidized and subsequently removed by the use of thermal oxide as a protecting layer.

Deposited oxides are also often used to protect surfaces. However, in the case of spacer removal, a deposited oxide would prevent the removal of the spacer. Furthermore, deposited oxides tend to suffer from nonuniformity. As a result, they may not provide a feasible screen for extension implants if they also contribute to the spacer thickness and nonuniformity.

Accordingly, there exists a need in the art to overcome the deficiencies and limitations described hereinabove.

SUMMARY OF THE INVENTION

In a first aspect of the invention, there is provided a method of making a semiconductor device that includes forming a transistor structure having one of an embedded epitaxial stressed material in a source and drain region and a stressed channel and well, subjecting the transistor structure to plasma oxidation, and removing spacer material from the transistor structure.

In a second aspect of the invention, there is provided a method of making a semiconductor device that includes forming a transistor structure having one of an embedded epitaxial stressed material in a source and drain region and a stressed channel and well, growing an oxide layer on the transistor structure utilizing plasma oxidation, and removing spacer material from the transistor structure.

In a third aspect of the invention, there is provided a method of making a semiconductor device that includes forming a transistor structure having one of an embedded epitaxial stressed material in a source and drain region and a stressed channel and well, growing an oxide layer on the transistor structure utilizing plasma oxidation, removing spacer material from the transistor structure, and removing the oxide layer.

DETAILED DESCRIPTION OF EMBODIMENTS OF THE INVENTION

The invention is directed to semiconductor devices and methods for manufacturing semiconductor devices with improved device performance, and more particularly to a semiconductor and method of making a semiconductor device which includes applying a protective layer over an embedded epitaxial stressed material and the semiconductor device made thereby. More specifically, the invention is directed to semiconductor devices and methods for manufacturing semiconductor devices with improved device performance, and more particularly to a transistor device which has an embedded SiGe that is subjected to surface protection using plasma oxidation. Thereafter, spacers can be removed from the transistor device.

Aspects of the invention can be used on devices having other embedded stress materials such as, e.g., embedded SiC.

The invention preferably utilizes plasma oxidation which is a low temperature (600° C. or less and preferably 400° C. or less), orientation and doping independent plasma oxidation process. Any plasma oxidation processes can be utilized such as slot plane antenna (SPA) plasma oxidation, although it is preferred that the plasma process forms a high quality uniform oxide, as good or better quality than thermal oxide. Due to the low temperature of this process, it is suitable for use with SiGe and should not result in the out-diffusion of Ge. If the source and drain regions have additional doping, such as boron (B), this should also not outdiffuse. Plasma oxidation should also not cause any oxide thickness difference. Furthermore, as is standard for oxidation processes, it should have the added benefit of smoothening the surface.

According to another non-limiting aspect of the invention, a hybrid orientation technology (HOT) substrate (and/or multiple orientation substrate) and embedded SiGe source and drain region(s) is subjected to plasma oxidation. This has the additional benefit of producing orientation independence. The plasma oxidation can also be used to protect the SiGe surface as a highly uniform screen oxide in order to prevent SiGe loss during resist strips and postcleans.

Figure 1:
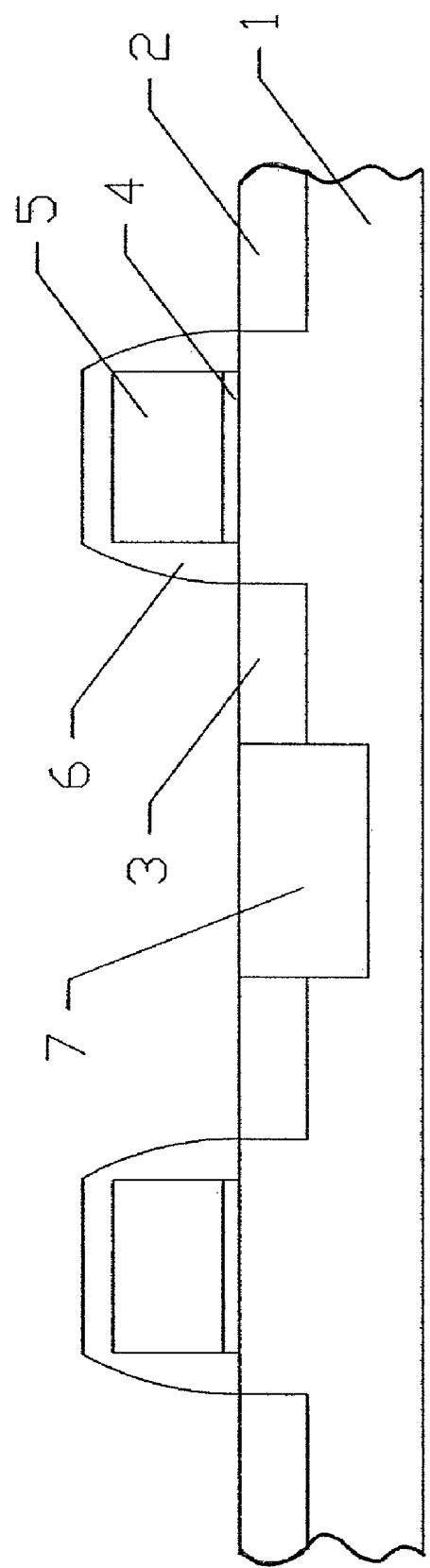
FIG. 1 shows a semiconductor device having spacer material according to the invention.

FIG. 1 shows an exemplary semiconductor device having one or more transistor structures according to the invention. The transistor structures can be an nFET or a pFET. Although the invention is not limited to SOI, the device may have an SOI substrate 1. A source region 3 and a drain region 2 are formed in the substrate 1 in an area of a gate. Each gate includes a gate dielectric film 4 and a gate electrode 5. A spacer material 6 is arranged on each gate. Finally, an isolation region 7 is arranged between the FETS. The source and drain regions 2, 3 include an embedded epitaxial stressed material, which can preferably include SiGe, and a stressed channel and well.

By way of non-limiting example, the substrate 1 can be of various semiconductor materials, such as, for example, Si, SiGe, SiC, SiGeC, etc. The substrate 1 may be fabricated using techniques well know to those skilled in the art. The substrate 1 may have any desired thickness based upon the intended use of the final semiconductor device.

Figure 2:
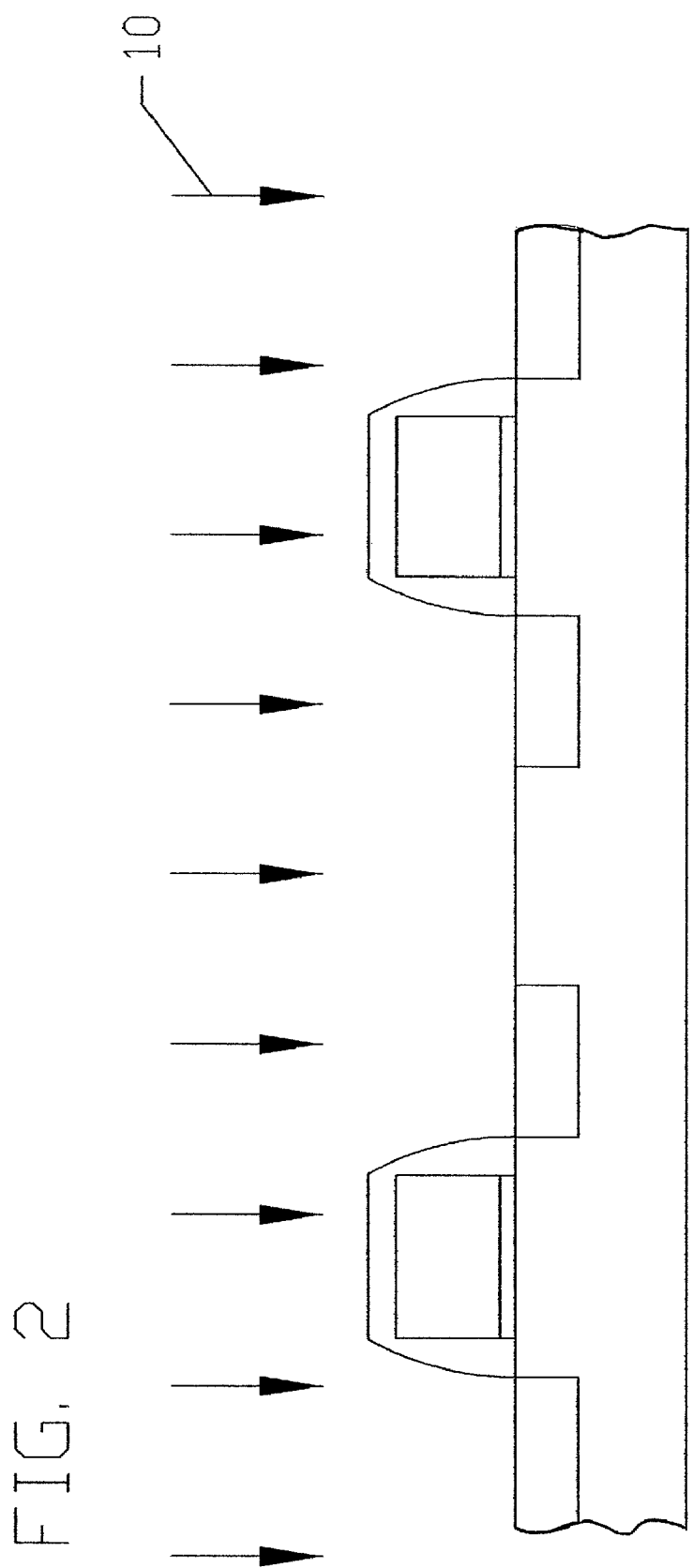
FIG. 2 shows the semiconductor device of FIG. 1 being subjected to plasma oxidation according to the invention.

As can be seen in FIG. 2, the semiconductor device is subjected to plasma oxidation 10. As explained above, plasma oxidation is a low temperature (600° C. or less), orientation and doping independent plasma oxidation process. Any plasma oxidation processes can be utilized provided it forms a high quality oxide uniform oxide, as good or better quality than thermal oxide. Due to the low temperature of this process, it is suitable for use with SiGe and should not result in the outdiffusion of Ge. If the source and drain regions have additional doping, such as boron (B), this should also not outdiffuse. Plasma oxidation should also not cause any oxide thickness difference. Furthermore, as is standard for oxidation processes, it should have the added benefit of smoothening the surface.

Figure 3:
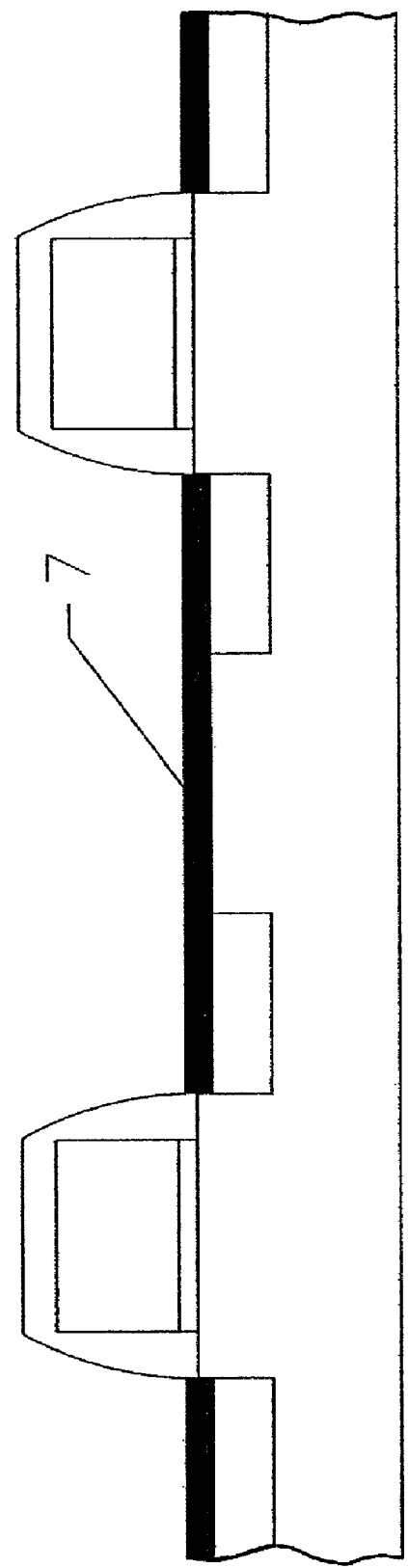
FIG. 3 shows the semiconductor device of FIG. 1 after being subjected to plasma oxidation shown in FIG. 2 according to the invention.

With reference to FIG. 3, the plasma oxidation can take place in known plasma processing tools, e.g., tools that strike a plasma and flow an oxidizing gas, and preferably causes an oxide layer 7 to be grown on the transistor device(s). The oxide layer 7 is preferably grown to a thickness of between about 12 Å (angstroms) and about 100 Å. The oxide layer 7 protects the embedded epitaxial stressed material, e.g., SiGe or other stressed materials, in the source and drain regions and the resulting stressed channel and well during subsequent processing.

Figure 4:
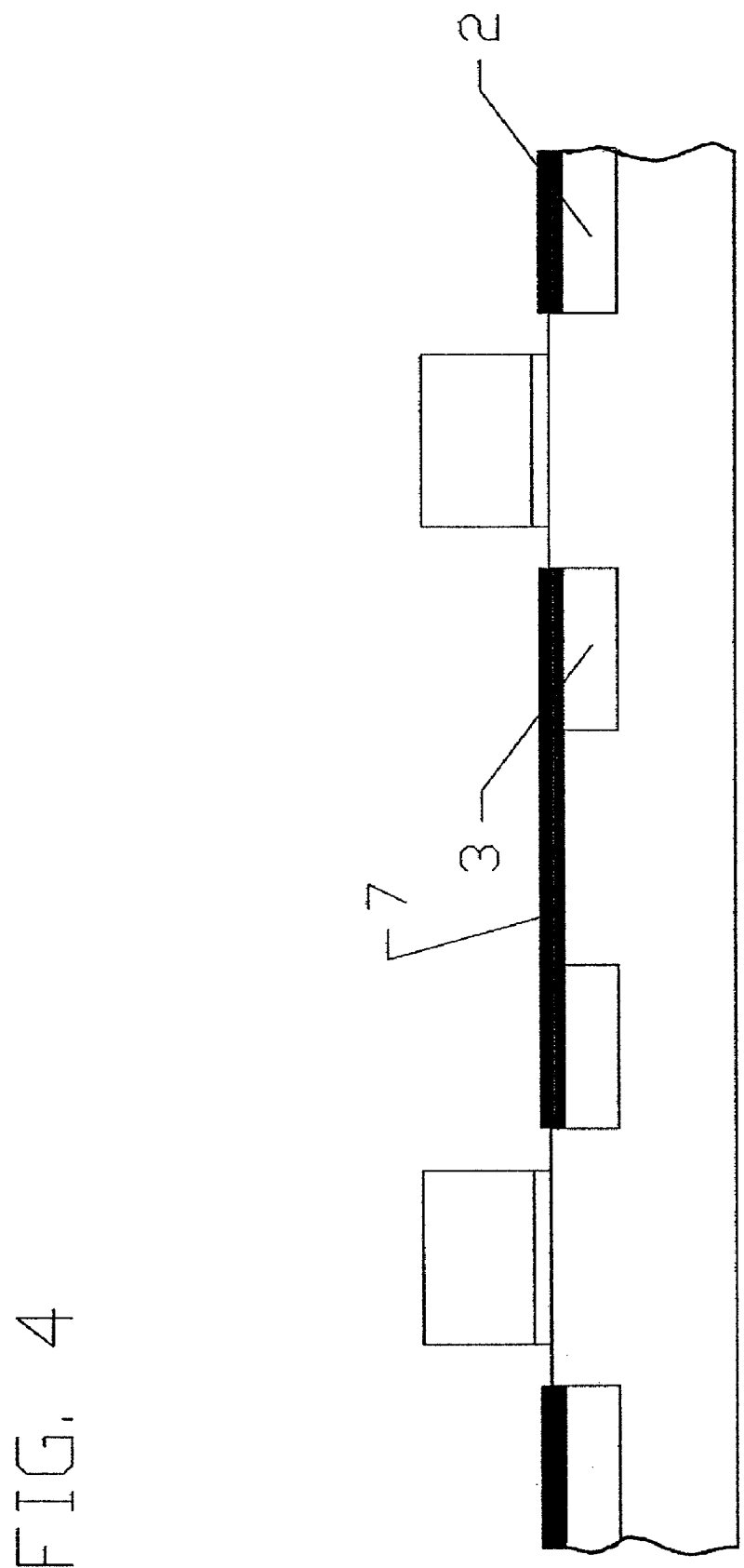
FIG. 4 shows the semiconductor device of FIG. 3 after being subjected to spacer material removal according to the invention.

With reference to FIG. 4, it can be seen that the removal of the spacer material from the gates does not result in removal of the oxide layer 7. The oxide layer 7 thus protects the source regions 3 and the drain regions 2 from metallic contamination during spacer 6 removal.

Figure 5:
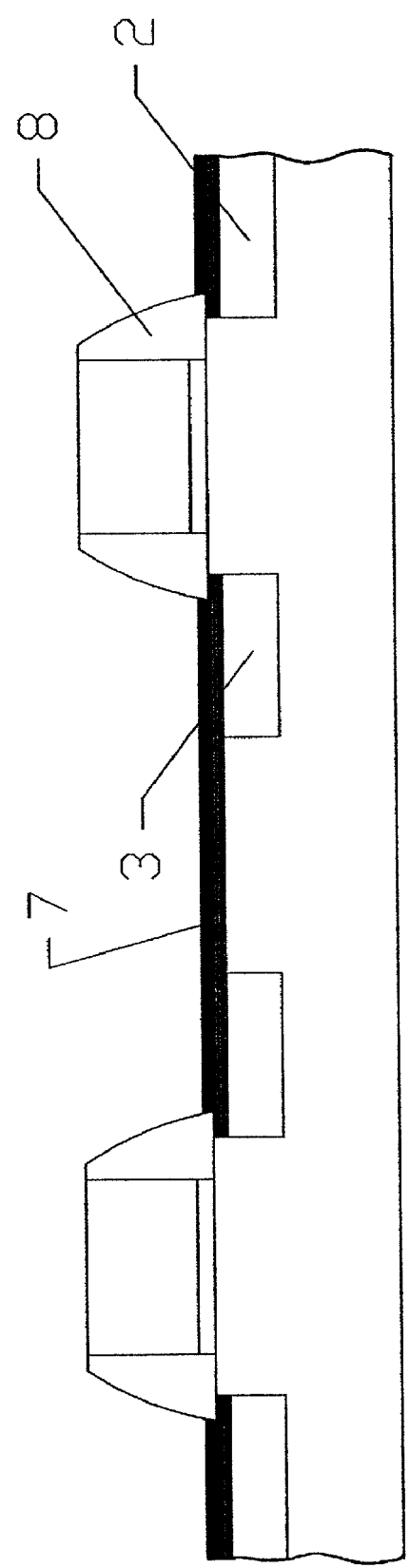
FIG. 5 shows the semiconductor device of FIG. 4 after transistor structures are substantially formed according to the invention.

With reference to FIG. 5, it can be seen that the oxide layer 7 continues to protect the source regions 3 and the drain regions 2 from metallic contamination during completion of the transistors, e.g., during formation of the sidewalls 8.

Figure 6:
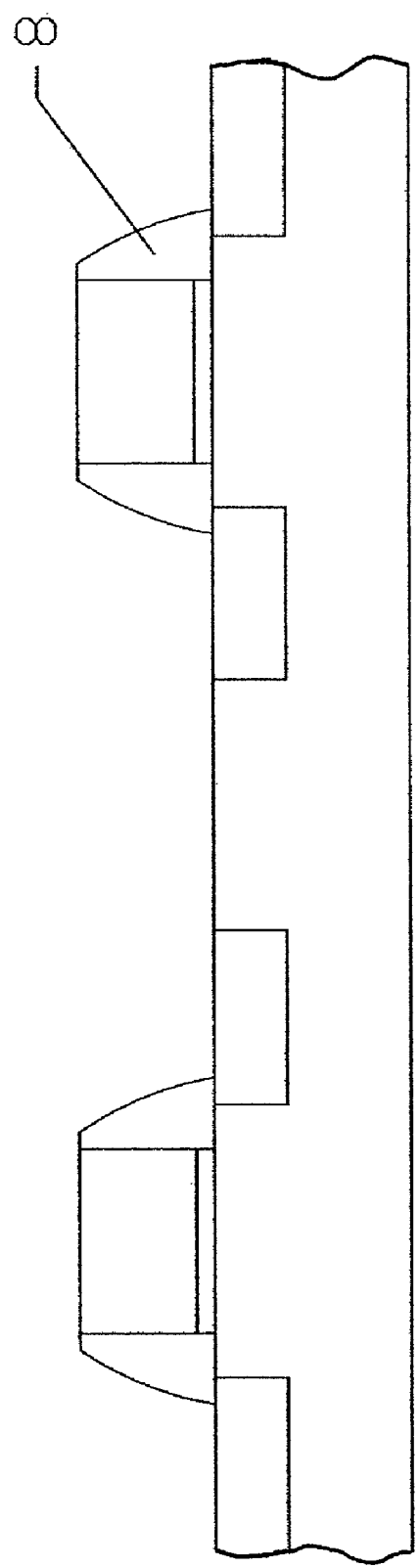
FIG. 6 shows the semiconductor device of FIG. 5 after the oxide layer formed by plasma oxidation is removed according to the invention.

With reference to FIG. 6, it can be seen that the oxide layer is preferably removed. This can take place any numbers of ways such using, e.g., silicide preclean.

Figure 7:
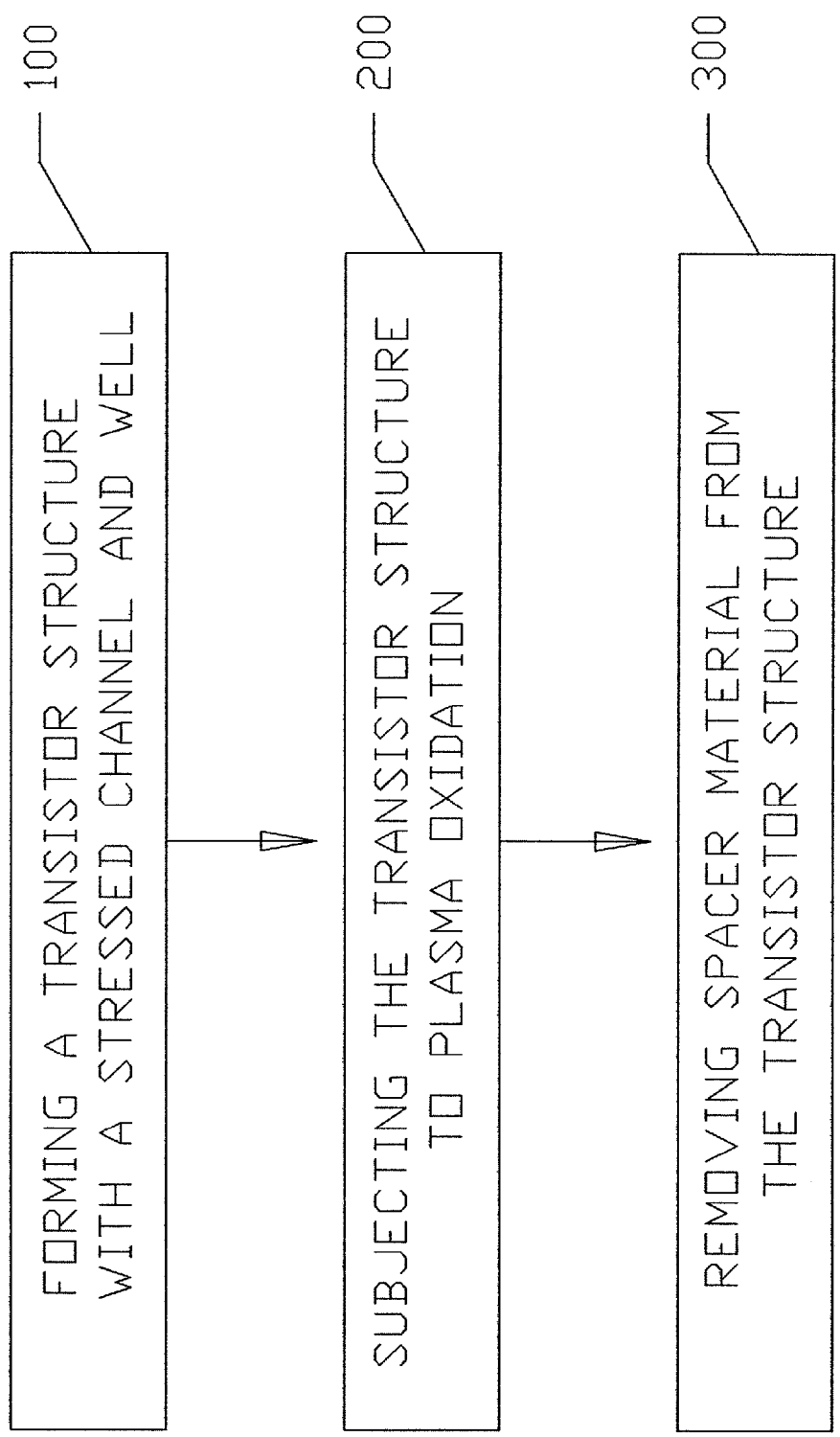
FIGS. 7-11 show flow diagrams illustrating non-limiting methods of making a semiconductor device according to the invention.

With reference to FIG. 7, there is shown one non-limiting method of making a semiconductor device which includes the step of forming a transistor structure having an embedded stressed well in step 100. The embedded stressed well can comprise an embedded epitaxial stressed material in a source and drain region. This is followed by subjecting the transistor substructure to plasma oxidation in step 200. Thereafter, a spacer material is removed from the transistor structure in step 300.

Figure 8:
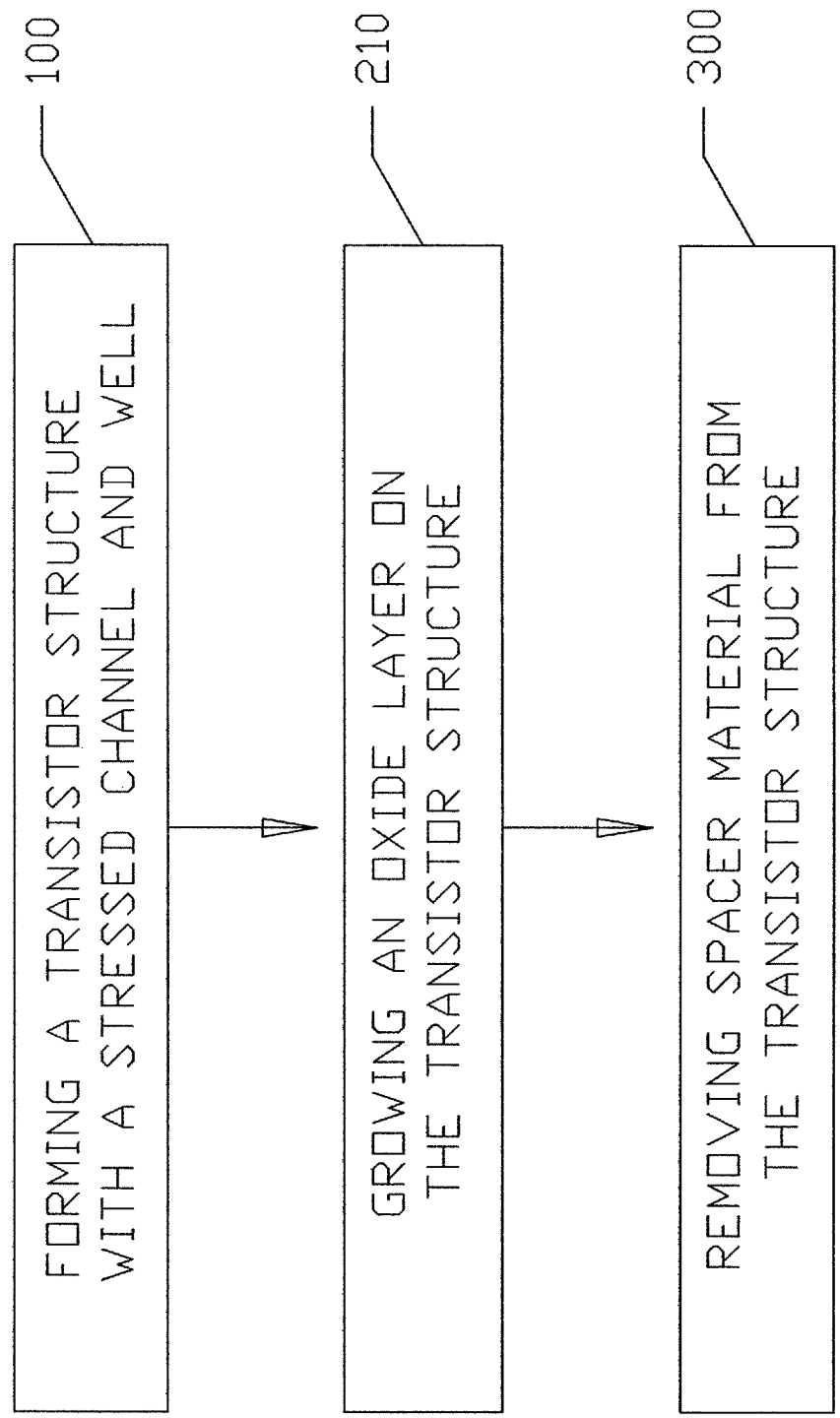

With reference to FIG. 8, there is shown another non-limiting method of making a semiconductor device which includes the step of forming a transistor structure having a stressed channel and well in step 100. The stressed channel and well can comprise an embedded epitaxial stressed material in a source and drain region. This is followed by growing an oxide layer on the transistor structure in step 210. Step 210 preferably takes place using plasma oxidation. Thereafter, a spacer material is removed from the transistor structure in step 300.

Figure 9:
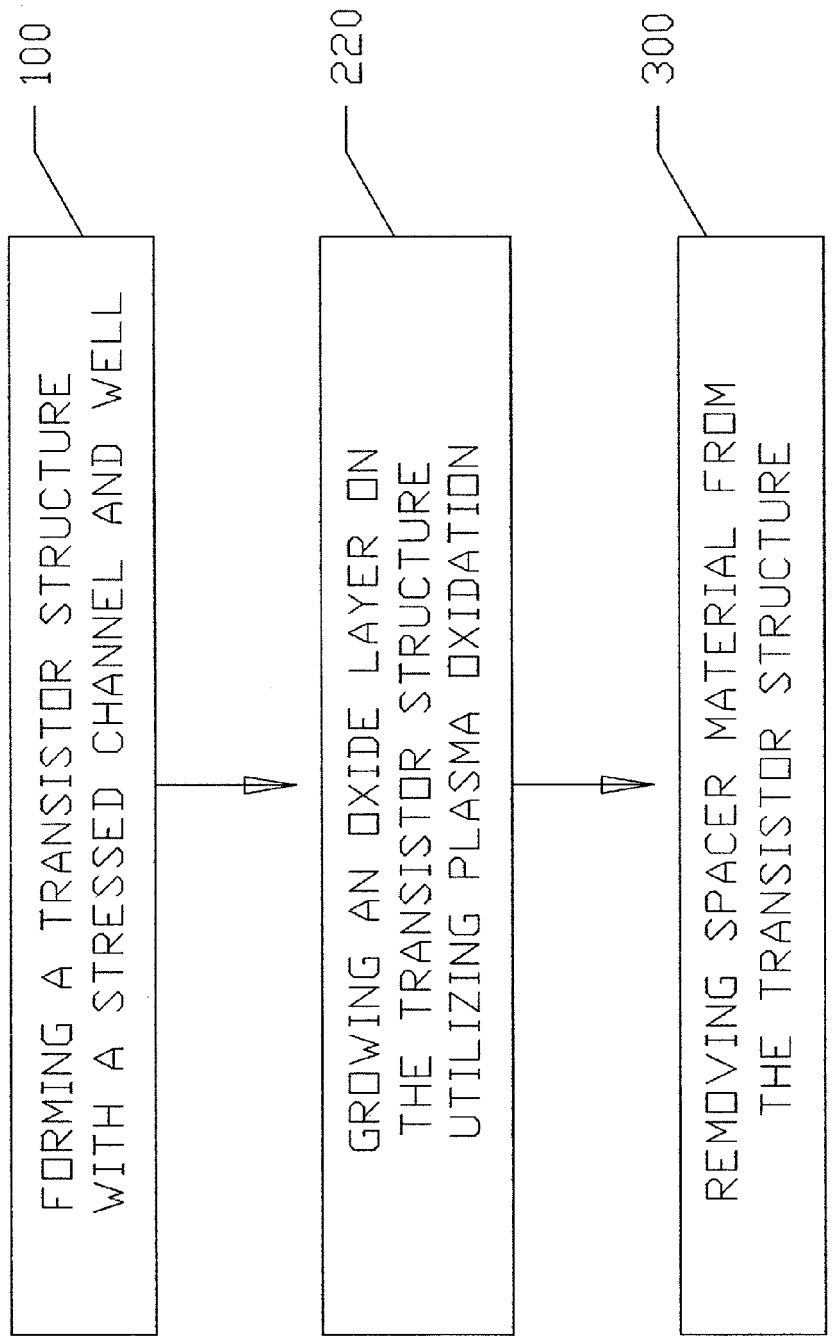

With reference to FIG. 9, there is shown another non-limiting method of making a semiconductor device which includes the step of forming a transistor structure having a stressed channel and well in step 100. The stressed channel and well can comprise an embedded epitaxial stressed material in a source and drain region. This is followed by growing an oxide layer on the transistor structure using plasma oxidation in step 220. Thereafter, a spacer material is removed from the transistor structure in step 300.

Figure 10:
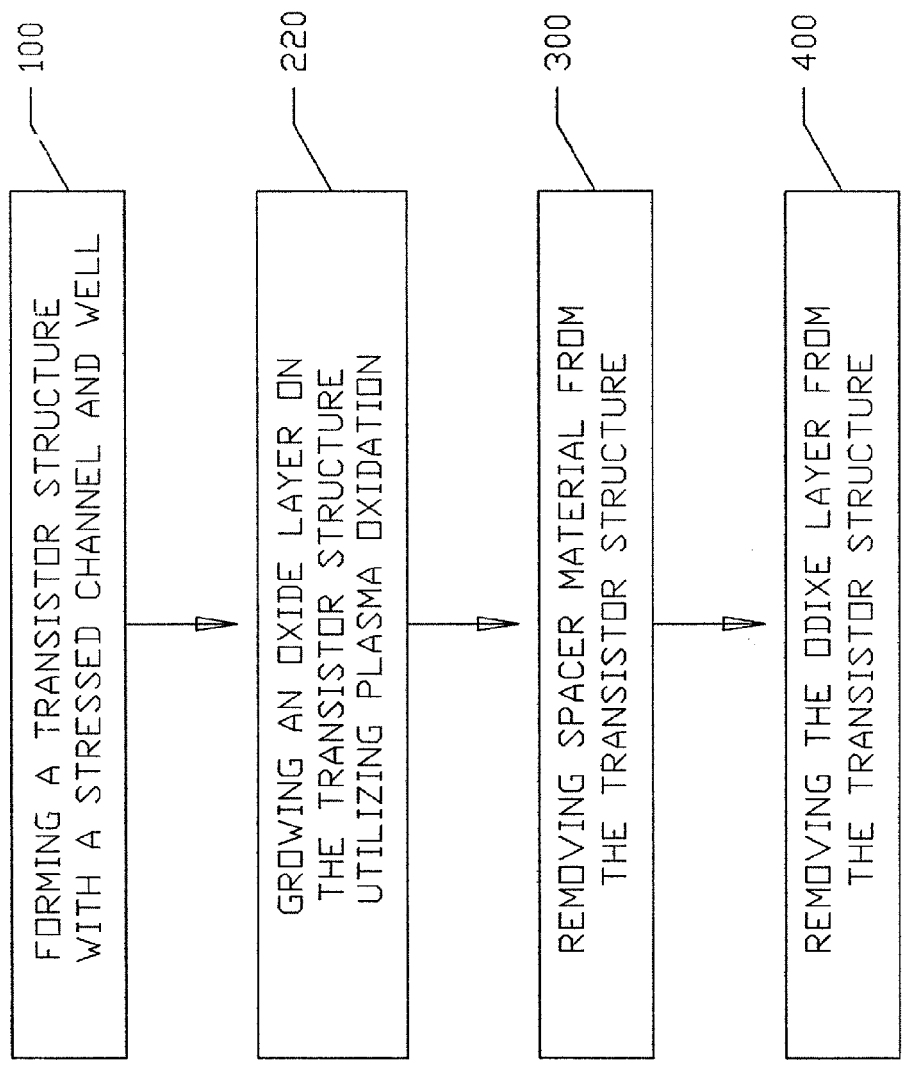

With reference to FIG. 10, there is shown another non-limiting method of making a semiconductor device which includes the step of forming a transistor structure having a stressed channel and well in step 100. The stressed channel and well can comprise an embedded epitaxial stressed material in a source and drain region. This is followed by growing an oxide layer on the transistor structure using plasma oxidation in step 220. Thereafter, a spacer material is removed from the transistor structure in step 300. Finally, the oxide layer is removed from the transistor structure in step 400. The oxide layer can be removed by, e.g., silicide preclean.

Figure 11:
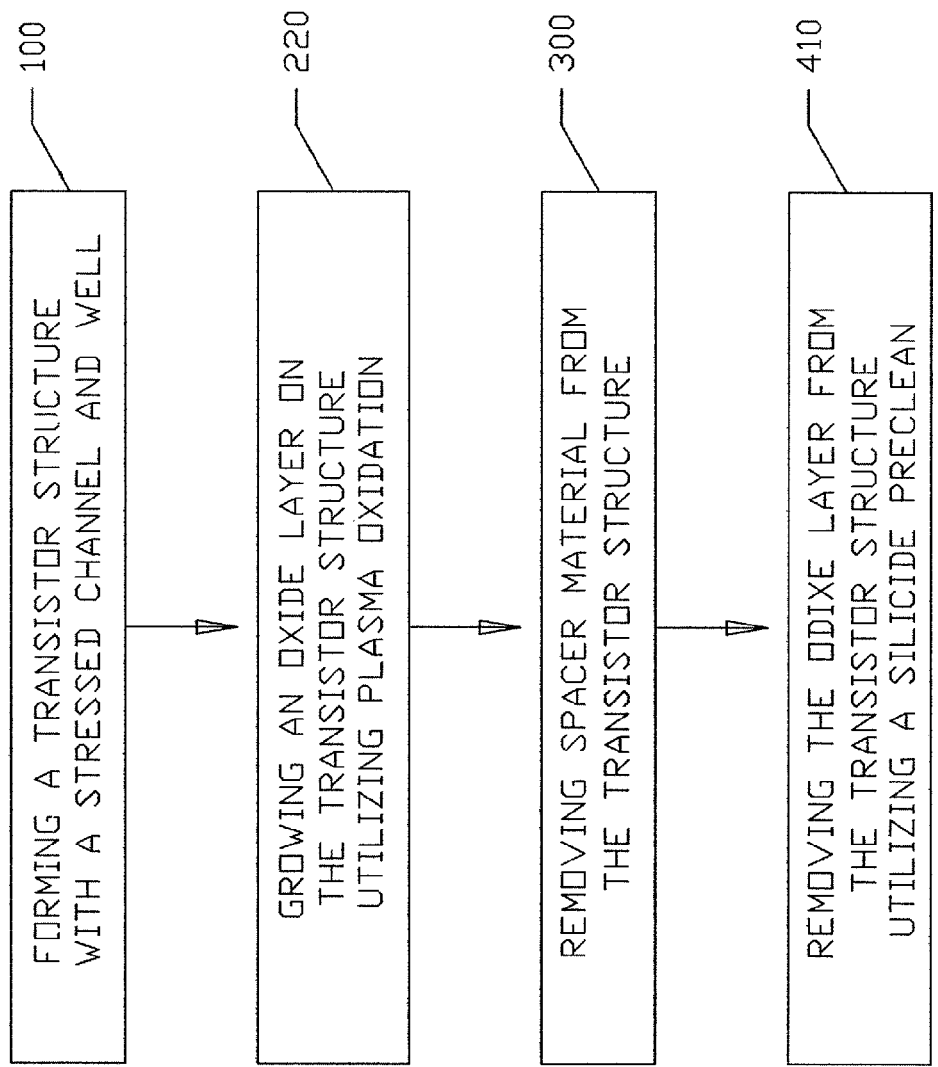

With reference to FIG. 11, there is shown another non-limiting method of making a semiconductor device which includes the step of forming a transistor structure having a stressed channel and well in step 100. The stressed channel and well can comprise an embedded epitaxial stressed material in a source and drain region. This is followed by growing an oxide layer on the transistor structure using plasma oxidation in step 220. Thereafter, a spacer material is removed from the transistor structure in step 300. Finally, the oxide layer is removed from the transistor structure using silicide preclean in step 410.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed:

1. A method of making a semiconductor device comprising one of an Si substrate and a silicon-on-insulator (SOI) substrate, the method comprising:

forming a transistor structure having one of an embedded epitaxial stressed material in a source and drain region and a stressed channel and well;

subjecting the transistor structure to plasma oxidation by growing an oxide layer on the embedded epitaxial stressed material;

forming a spacer material on a gate structure of the transistor structure; and removing the spacer material from the transistor structure, wherein the plasma oxidation protects the embedded epitaxial material in the source and drain region from one or more resist strips and/or cleaning steps, and wherein the subjecting protects the source and drain region from metallic contamination during spacer removal.

2. A method of making a semiconductor device comprising one of an Si substrate and a silicon-on-insulator (SOI) substrate, the method comprising:

forming a transistor structure having one of an embedded epitaxial stressed material in a source and drain region and a stressed channel and well;

growing an oxide layer on the transistor structure utilizing plasma oxidation;

removing the oxide layer using a silicide preclean; and removing a spacer material from the transistor structure, wherein the plasma oxidation protects the embedded epitaxial material in the source and drain region from one or more resist strips and/or cleaning steps, and wherein the growing protects the source and drain region from metallic contamination during spacer removal.

3. The method of claim 2, wherein the embedded epitaxial stressed material comprises SiGe.

4. The method of claim 2, further comprising forming the spacer material on a gate structure of the transistor structure.

5. The method of claim 2, wherein the transistor structure comprises an nFET.

6. The method of claim 2, wherein the transistor structure comprises a pFET.

7. The method of claim 2, wherein the plasma oxidation occurs at a temperature of about 600 degrees C. or less.

8. The method of claim 2, wherein the growing produces an oxide layer of between about 12 Å (angstroms) and about 100 Å.

9. The method of claim 2, wherein the growing prevents Ge from diffusing into an Si substrate.

10. The method of claim 1, wherein the embedded epitaxial stressed material comprises SiGe.

11. The method of claim 1, further comprising forming the spacer material on a gate structure of the transistor structure.

12. The method of claim 1, wherein the transistor structure comprises an nFET.

13. The method of claim 1, wherein the transistor structure comprises a pFET.

14. The method of claim 1, wherein the plasma oxidation occurs at a temperature of about 600 degrees C. or less.

15. The method of claim 1, wherein the subjecting produces an oxide layer of between about 12 Å (angstroms) and about 100 Å.

16. The method of claim 1, wherein the growing prevents Ge from diffusing into an Si substrate.

17. The method of claim 1, wherein the subjecting comprises growing an oxide layer on the embedded epitaxial stressed material.

18. The method of claim 1, wherein the subjecting comprises growing an oxide layer on the source and drain region.

19. A method of making a semiconductor device comprising:

forming a transistor structure having one of an embedded epitaxial stressed material in a source and drain region and a stressed channel;

growing an oxide layer on the transistor structure;

removing the oxide layer; and removing a spacer material from the transistor structure, wherein the plasma oxidation protects the embedded epitaxial material in the source and drain region from one or more resist strips and/or cleaning steps, and wherein the oxide layer protects the source and drain region from metallic contamination during removal of the spacer material.

20. The method claim 19, wherein at least one of:

the semiconductor device comprises one of an Si substrate and a silicon-on-insulator (SOI) substrate;

the growing an oxide layer on the transistor structure utilizes plasma oxidation; and the removing the oxide layer utilizes a silicide preclean.

* * * * *